(12) United States Patent
Nagashima et al.

(10) Patent No.: US 12,199,678 B2
(45) Date of Patent: Jan. 14, 2025

(54) OPTICAL MODULE

(71) Applicant: FURUKAWA ELECTRIC CO., LTD., Tokyo (JP)

(72) Inventors: Kazuya Nagashima, Tokyo (JP); Yozo Ishikawa, Tokyo (JP); Atsushi Izawa, Tokyo (JP); Kazuki Yamaoka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/304,568

(22) Filed: Jun. 23, 2021

(65) Prior Publication Data
US 2021/0320719 A1 Oct. 14, 2021

Related U.S. Application Data

(63) Continuation of application No. PCT/JP2019/051243, filed on Dec. 26, 2019.

(30) Foreign Application Priority Data

Dec. 28, 2018 (JP) ................................ 2018-246643

(51) Int. Cl.
*H04B 10/40* (2013.01)
*H01S 5/00* (2006.01)
(Continued)

(52) U.S. Cl.
CPC ........... *H04B 10/40* (2013.01); *H01S 5/0085* (2013.01); *H01S 5/02218* (2021.01);
(Continued)

(58) Field of Classification Search
CPC ...... H04B 10/40; H04B 10/50; H04B 10/505; H04B 10/572; H04B 10/60; H04B 10/61;
(Continued)

(56) References Cited

U.S. PATENT DOCUMENTS 9,871,590 B2    1/2018  Matsui
2011/0135312 A1*  6/2011  El-Ahmadi ........... H04J 3/1658
                                          714/752
(Continued)

FOREIGN PATENT DOCUMENTS

CN    102411006 A    4/2012
JP    2015-079092 A   4/2015
(Continued)

OTHER PUBLICATIONS

Priyadarshi et al., The first hot pluggable 2.5 Gbs DWDM transceiver in an SFP form factor, Feb. 2005, IEEE, All Document. (Year: 2005).*

(Continued)

*Primary Examiner* — Dibson J Sanchez
(74) *Attorney, Agent, or Firm* — Oblon, McClelland, Maier & Neustadt, L.L.P.

(57) ABSTRACT

An optical module includes: a laser device; a wavelength detector; a modulator; a modulator driver; a coherent mixer; a photoelectric element; a transimpedance amplifier; and a casing. Further, the laser device is arranged such that the laser device outputs a laser light beam in a direction opposite to a side on which the optical output unit is arranged in the casing.

14 Claims, 8 Drawing Sheets

(51) Int. Cl.
    *H01S 5/02218*    (2021.01)
    *H01S 5/0239*     (2021.01)
    *G02B 6/42*           (2006.01)
    *H04B 10/50*          (2013.01)
    *H04B 10/572*         (2013.01)
    *H04B 10/60*          (2013.01)
    *H04B 10/61*          (2013.01)

(52) U.S. Cl.
    CPC .......... *H01S 5/0239* (2021.01); *G02B 6/4246* (2013.01); *H04B 10/50* (2013.01); *H04B 10/505* (2013.01); *H04B 10/572* (2013.01); *H04B 10/60* (2013.01); *H04B 10/61* (2013.01)

(58) Field of Classification Search
    CPC ............... H01S 5/0085; H01S 5/02224; H01S 5/02325; H01S 5/0239; H01S 5/0687; H01S 5/02218; G02B 6/4246; G02B 6/4214; G02B 6/4215; G02B 6/4281; G02B 6/4284; G02B 6/4286; G02B 6/4292; G02F 1/025; H01L 31/0232
    USPC ................. 398/135–139, 182–201, 202–214
    See application file for complete search history.

(56) References Cited

U.S. PATENT DOCUMENTS

| | | | |
|---|---|---|---|
| 2011/0142457 A1 | 6/2011 | Betty et al. | |
| 2011/0206328 A1* | 8/2011 | Wang | G02B 6/4246 385/94 |
| 2011/0243556 A1* | 10/2011 | Nagarajan | H04J 14/06 398/43 |
| 2014/0153931 A1* | 6/2014 | Doerr | H04B 10/40 398/135 |
| 2015/0104177 A1 | 4/2015 | Kato et al. | |
| 2015/0311976 A1* | 10/2015 | Ishizaka | H04B 10/40 398/38 |
| 2015/0318952 A1* | 11/2015 | Butrie | H04B 10/503 398/139 |
| 2016/0013609 A1 | 1/2016 | Doerr | |
| 2016/0380698 A1* | 12/2016 | Elahmadi | G02B 6/00 398/135 |
| 2017/0302384 A1* | 10/2017 | Tsurumi | H04J 14/02 |
| 2018/0123720 A1* | 5/2018 | Nomura | H04B 10/572 |
| 2018/0231726 A1* | 8/2018 | Mizuno | G02B 6/4246 |
| 2018/0287710 A1* | 10/2018 | Komatsu | G02B 6/4292 |
| 2018/0292607 A1* | 10/2018 | Dong | G02B 6/12002 |
| 2018/0351684 A1* | 12/2018 | Osenbach | H04B 10/506 |
| 2019/0052056 A1* | 2/2019 | Onaka | G02B 6/4213 |
| 2019/0097728 A1* | 3/2019 | Frankel | H04B 10/505 |
| 2019/0245618 A1* | 8/2019 | Bruno | H04B 10/2589 |
| 2019/0285815 A1* | 9/2019 | Sugiyama | H04B 10/614 |
| 2019/0372664 A1* | 12/2019 | Sugiyama | H04B 10/40 |
| 2020/0014484 A1* | 1/2020 | Chen | H04B 10/2589 |
| 2020/0064404 A1* | 2/2020 | Sugiyama | G01R 31/282 |
| 2020/0150366 A1* | 5/2020 | Tittenhofer | G02B 6/4278 |
| 2020/0166705 A1* | 5/2020 | Pelletier | G02B 6/14 |
| 2020/0204258 A1* | 6/2020 | Bravi | H04B 10/564 |
| 2020/0235819 A1* | 7/2020 | Goebuchi | H04B 10/61 |
| 2020/0371302 A1* | 11/2020 | Chou | H01R 13/6691 |
| 2021/0021338 A1* | 1/2021 | Calabrò | H04B 10/50 |

FOREIGN PATENT DOCUMENTS

| | | |
|---|---|---|
| JP | 2016-081060 A | 5/2016 |
| JP | 2017-098362 A | 6/2017 |

OTHER PUBLICATIONS

International Search Report issued Feb. 25, 2020 in PCT/JP2019/051243 filed on Dec. 26, 2019, citing documents AA-AC, AO-AP & AX therein, 3 pages.

Lal et al., "Full C-Band Tunable Coherent Transmitter and Receiver InP Photonic Integrated Circuits", $42^{nd}$ European Conference and Exhibition on Optical Communications, Sep. 2016, 3 pages.

Japanese Office Action dated Jul. 18, 2023 in Japanese Patent Application No. 2020-562435 with English machine translation, 11 pages.

Combined Chinese Office Action and Search Report issued Nov. 10, 2023 in Chinese Application 201980086136.X, (with English translation of Office Action), citing documents 15 therein, 23 pages.

\* cited by examiner

OPTICAL MODULE

CROSS-REFERENCE TO RELATED APPLICATION(S)

This application is a continuation of International Application No. PCT/JP2019/051243, filed on Dec. 26, 2 2019 which claims the benefit of priority of the prior Japanese Patent Application No. 2018-246643, filed on Dec. 28, 2018, the entire contents of which are incorporated herein by reference.

BACKGROUND

The present disclosure relates to an optical module.

In a high capacity optical communication system, a digital coherent transceiver is used as an optical transceiver that is an optical module that transmits and receives a signal light beam. A digital coherent transceiver is configured by housing a plurality of optical components and electronic components in one casing and size reduction is always required. For example, Japanese Laid-open Patent Publication No. 2016-081060 discloses an optical transceiver for complying with the CFP2 standards in MSA (Multi-source Agreement) that is an agreement on compatible products with a common specification.

SUMMARY

There is a need for providing an optical module enabling realization of a small-sized light receiver.

An optical module according to an embodiment includes: a laser device to output a laser light beam; a wavelength detector to which the laser light beam that is output from the laser device is input and that is for detecting a wavelength of the input laser light beam; a modulator to modulate the laser light beam and generate a modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the laser device is arranged such that the laser device outputs the laser light beam in a direction opposite to a side on which the optical output unit is arranged in the casing.

An optical module according to an embodiment includes: a laser device to output laser light beam; a wavelength detector to which the laser light beam that is output from the laser device is input and that is for detecting a wavelength of the input laser light beam; a modulator to modulate the laser light beam and generate modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the laser device or the wavelength detector is arranged between a center line of the coherent mixer in the width direction and a center line of the modulator in the width direction in the width direction of the casing.

An optical module according to an embodiment includes: a laser device to output laser light beam; a wavelength detector to which the laser light beam that is output from the laser device is input and that is for detecting a wavelength of the input laser light beam; a modulator to modulate the laser light beam and generate modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the modulator has a turning structure by which a direction in which light beam that is input travels turns inside.

An optical module according to an embodiment includes: a laser device to output laser light beam; a wavelength detector to which the laser light beam that is output from the laser device is input and that is for detecting a wavelength of the input laser light beam; a modulator to modulate the laser light beam and generate modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the optical module is provided such that optical axes of at least two light beams intersect with each other in the casing.

An optical module according to an embodiment includes: a laser device to output laser light beam; a wavelength detector to which the laser light beam that is output from the laser device is input and that is for detecting a wavelength of the input laser light beam; a modulator to modulate the laser light beam and generate modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the laser device and the wavelength detector are arranged such that a position in the laser device in which laser light beam to be input to the wavelength detector is output and a position in the wavelength detector in which the laser light beam is input differ from each other in the width direction of the casing, the modulator and the modulator driver are arranged in series approximately in parallel and thus configure a modulation unit, the coherent mixer, the photoelectric element, and the transimpedance amplifier are arranged in series approximately in parallel in the longitudinal direction of the casing and thus configure an optical processing unit, the modulation unit and the optical processing unit are arranged in parallel in the width direction, in the modulator, a position in which the laser light beam is input and a position in which the modulated light beam is output are arranged on the same side surface, and a side surface of the coherent mixer to which the input signal light beam is input is approximately parallel to the side surface of the modulator.

An optical module according to an embodiment includes: a laser device to output laser light beam; a wavelength detector to which the laser light beam that is output from the laser device is input and that is for detecting a wavelength of the input laser light beam; a modulator to modulate the laser light beam and generate modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the laser device and the wavelength detector are arranged such that a position in the laser device in which laser light beam to be input to the wavelength detector is output and a position in the wavelength detector in which the laser light beam is input differ from each other in the width direction of the casing, the modulator and the modulator driver are arranged in series approximately in parallel in the longitudinal direction of the casing, thus configuring a modulation unit, the coherent mixer, the photoelectric element, and the transimpedance amplifier are arranged in series approximately in parallel in the longitudinal direction of the casing, thus configure an optical processing unit, the modulation unit and the optical processing unit are arranged in parallel in the width direction, in the modulator, a position in which the laser light beam is input and a position in which the modulated light beam is output are arranged on the same side surface, and a side surface of the coherent mixer to which the local light beam is input is approximately orthogonal to the side surface of the modulator.

An optical module according to an embodiment includes: a laser device to output laser light beam; a wavelength detector to which the laser light beam that is output from the laser device is input and that is for detecting a wavelength of the input laser light beam; a modulator to modulate the laser light beam and generate modulated light beam; a modulator driver to drive the modulator; a coherent mixer to which an input signal light beam that is input from outside and a local light beam are input and that is to process the input signal light beam and generate a processed signal light beam; a photoelectric element to convert the processed signal light beam into a current signal; a transimpedance amplifier to convert the current signal into a voltage signal; and a casing in which the laser device, the wavelength detector, the modulator, the modulator driver, the coherent mixer, the photoelectric element, and the transimpedance amplifier are mounted, that is sealed in an airtight manner, that includes an optical output unit to output an output signal light beam containing the modulated light beam and an optical input unit to which the input signal light beam is input, and that has a length equal to or smaller than 15 mm in a width direction orthogonal to a longitudinal direction. Further, the laser device and the wavelength detector are arranged in series approximately in parallel in the longitudinal direction of the casing and are arranged such that a position in the laser device in which laser light beam to be input to the wavelength detector is output and a position in the wavelength detector in which the laser light beam is input approximately coincide in the width direction of the casing, thus configuring a laser assembly, the modulator and the modulator driver are arranged in series approximately in parallel in the longitudinal direction of the casing, thus configuring a modulation unit, the coherent mixer, the photoelectric element, and the transimpedance amplifier are arranged in series approximately in parallel in the longitudinal direction of the casing, thus configuring an optical processing unit, the laser assembly, the modulation unit, and the optical processing unit are arranged in parallel in the width direction, in the modulator, a position in which the laser light beam is input and a position in which the modulated light beam is output are arranged on the same side surface, and a side surface of the coherent mixer to which the input signal light beam is input is approximately parallel to the side surface of the modulator.

DETAILED DESCRIPTION

In the optical transceiver according to Japanese Laid-open Patent Publication No. 2016-081060, for example, a modulator and an optical receiver are housed in separate casings, respectively, and are housed together with other optical components and electronic components in a casing. As for optical modules serving as optical transceivers, however, further size reduction is required in the future and particularly size reduction in a width direction is required.

Embodiments will be described below with reference to the drawings. Note that the embodiments do not limit the disclosure. In the illustration of the drawings, the same or corresponding elements are denoted with the same reference numbers as appropriate. Note that the drawings are schematic and the relationship in size among components and ratios of the components may be different from actual ones. Parts whose relationship and ratios in size differ among drawings may be contained.

First Embodiment

Figure 1:
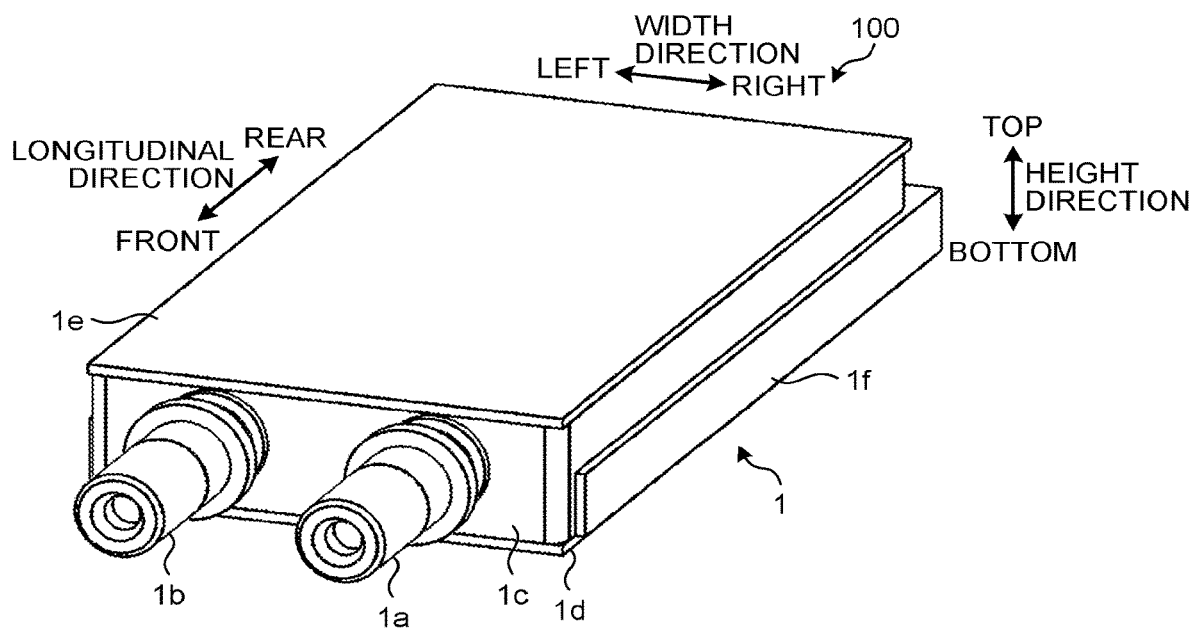
FIG. 1 is a schematic diagram illustrating an exterior of an optical module according to a first embodiment.

FIG. 1 is a schematic diagram illustrating an exterior of an optical module according to a first embodiment. In FIG. 1, a longitudinal direction, a width direction and a height direction that are orthogonal to one another are defined in order to indicate directions. An optical module 100 includes a casing 1. The casing 1 includes a signal light output port 1a, a signal light input port 1b, a side wall part 1c, a bottom plate part 1d, a top cover part 1e, and a terminal unit 1f. The side wall part 1c is a member having a shape of a frame having four faces extending in the height direction and the longitudinal direction or the width direction and each of the faces is approximately orthogonal to the bottom plate part 1d. The signal light output port 1a and the signal light input port 1b are provided on a front side of the side wall part 1c in the longitudinal direction. An optical fiber for outputting signal light to the outside is connected to the signal light output port 1a. An optical fiber for inputting a signal light beam from outside is connected to the signal light input port 1b. The bottom plate part 1d is a platy member that extends in the longitudinal direction and the width direction. The top cover part 1e is a platy member that is opposed to the bottom plate part 1d and extends in the longitudinal direction and the width direction. The terminal unit 1f is provided on sides of the side wall part 1c excluding the front side in the longitudinal direction.

The bottom plate part 1d is made of a material having high thermal conductivity, such as copper-tungsten (CuW), copper molybdenum (CuMo), or aluminum oxide ($Al_2O_3$). Other parts of the casing 1 are made of a material having a low coefficient of thermal expansion, such as Fe—Ni—Co alloy or aluminum oxide ($Al_2O_3$).

Figure 2:
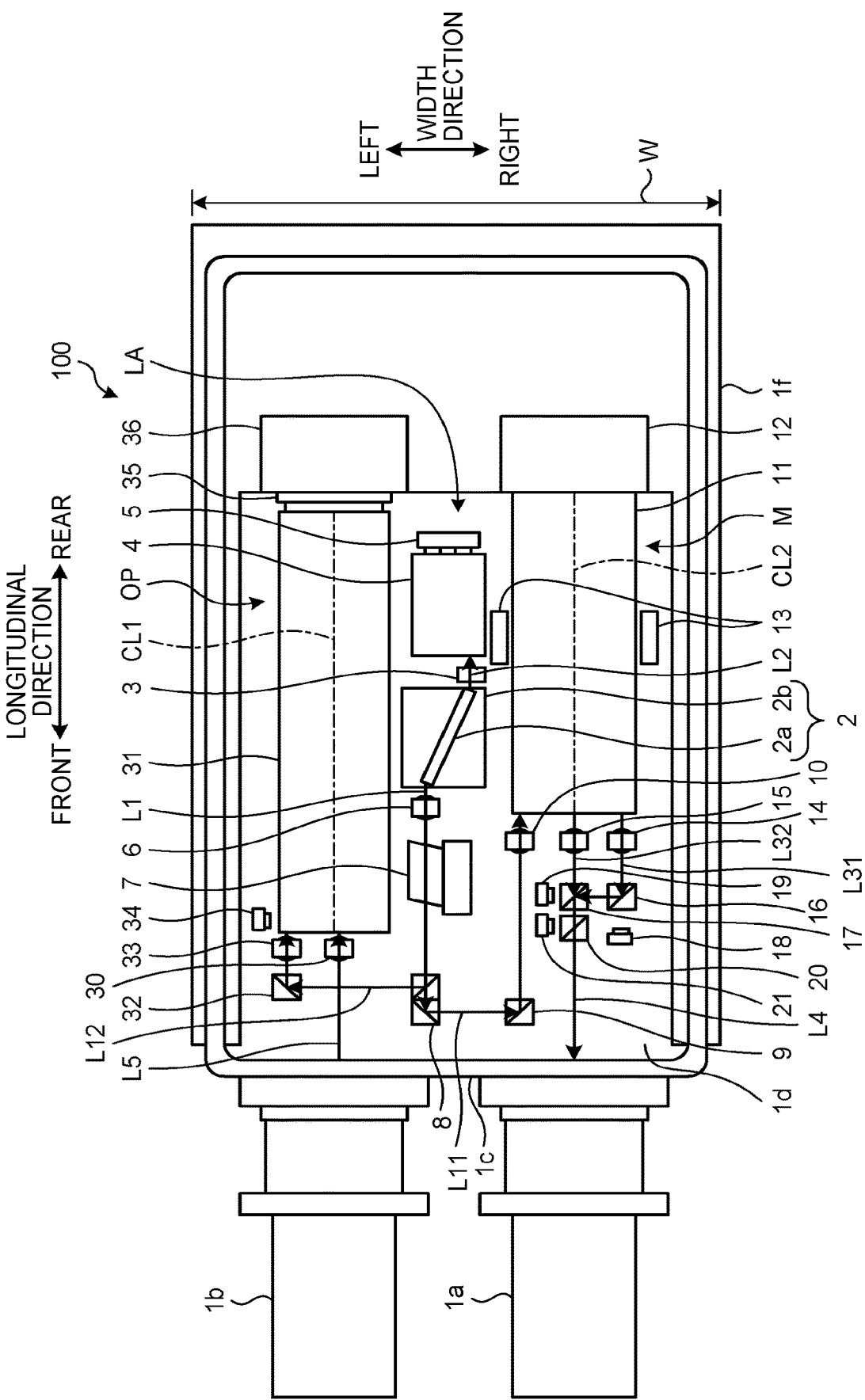
FIG. 2 is a schematic diagram illustrating an internal configuration of the optical module illustrated in FIG. 1.

FIG. 2 is a schematic diagram illustrating an internal configuration of the optical module 100 and is a top view of the optical module 100 without the top cover part 1e. As illustrated in the drawing, the terminal unit 1f protrudes to the outside and inside of the optical module 100. The terminal unit 1f is made of an insulating material and an interconnect pattern formed of a conductor is formed on the surface and in the terminal unit 1f. The interconnect pattern of the terminal unit 1f is electrically connected to a controller that is provided outside the optical module 100 and controls operations of the optical module 100. The controller is, for example, configured including an integrated circuit (IC).

In the optical module 100, the following components are stored: a chip on sub-mount 2, a lens 3, a wavelength locker 4 serving as a wavelength detector, a photodiode (PD) array 5, a lens 6, an optical isolator 7, a beam splitter 8, a mirror 9, a lens 10, a modulator 11, a modulator driver 12, a terminator 13, lenses 14 and 15, a beam splitter 16, a polarized beam combiner 17, monitor PDs 18 and 19, a beam splitter 20 and a monitor PD 21. Furthermore, in the optical module 100, the following components are housed: a lens 30, a coherent mixer 31, a mirror 32, a lens 33, a monitor PD 34, a balanced PD array 35, and a transimpedance amplifier (TIA) 36.

In the optical module 100, these components are mounted in the casing 1 and the casing 1 is sealed in an airtight manner with the top cover part 1e being attached thereto. These components excluding the modulator driver 12 and the TIA 36 are mounted on a base or a temperature adjustment element that is arranged in the casing 1. The modulator driver 12 and the TIA 36 are mounted on the terminal unit 1f.

The optical module 100 is configured as an optical transceiver that outputs an output signal light beam from the signal light output port 1a serving as an optical output unit and to which an input signal light beam is input from the signal light input port 1b serving as an optical input unit. Configurations and functions of the respective components will be described below.

Optical Transmitter

First of all, configurations and functions of components that function as an optical transmitter will be described.

The chip on sub-mount 2 includes a laser device 2a and a sub-mount 2b. The laser device 2a is, for example, a wavelength-tunable laser device. The sub-mount 2b is made of a material with high thermal conductivity and releases heat generated by the laser device 2a efficiently to the base on which the sub-mount 2b is mounted.

The laser device 2a is supplied with a power through the interconnect pattern that is formed on the terminal unit if and outputs a laser light beam L1 that is a continuous wave (CW) and a linearly polarized wave from a front facet that is positioned on the front side in the longitudinal direction toward the front side in the longitudinal direction. The laser device 2a outputs a laser light beam L2 for locking the wavelength from a rear facet to a rear side in the longitudinal direction.

The lens 3 focuses the laser light beam L2 and causes the laser light beam L2 to be input to the wavelength locker 4. The wavelength locker 4 is a known wavelength locker consisting of a planer lightwave circuit (PLC). The wavelength locker 4 splits the laser light beam L2 into three light beams, outputs one of the light beams to the PD array 5, causes the remaining two light beams to pass through two filters whose transmissivity to wavelengths changes periodically and that have wavelength discrimination properties, respectively, and then outputs the two laser light beams to the PD array 5. The two filters, for example, consist of ring resonators or etalon filters and have different transmission wavelength properties, respectively.

The PD array 5 is configured by arraying three PDs in an array. The three PDs of the PD array 5 receive three laser light beams that are output by the wavelength locker 4, respectively, and output current signals corresponding to intensities of the received light beams. Each of the current signals is transmitted to the controller via the interconnect pattern that is formed on the terminal unit 1f and is used to detect and control the wavelength of the laser light beam L1.

The laser device 2a and the wavelength locker 4 are arranged along the longitudinal direction. The laser device 2a and the wavelength locker 4 are arranged such that a position in the laser device 2a in which the laser light beam L2 to be input to the wavelength locker 4 is output and a position in the wavelength locker 4 in which the laser light beam L2 is input approximately coincide with each other in the width direction, thus configuring a laser assembly LA.

On the other hand, the lens 6 collimates the laser light beam L1 and outputs the laser light beam L1 to the optical isolator 7. The optical isolator 7 allows the laser light beam L1 to pass through to the side of the beam splitter 8 and prevents light beam traveling from the side of the beam splitter 8 from passing through. Thus, the optical isolator 7 inhibits reflected light, etc., from being input to the laser device 2a.

The beam splitter 8 splits the laser light beam L1 having passed through the optical isolator 7 into laser light beams L11 and L12. The laser light beam L11 travels to the right side in the width direction and the laser light beam L12 travels to the left side in the width direction. The laser light beam L12 will be described in detail below.

The mirror 9 reflects the laser light beam L11 and changes its travel direction to the rear side in the longitudinal direction. The lens 10 focuses the laser light beam L11 and causes the laser light beam L11 to be input to the modulator 11.

The modulator 11 has a shape of an approximate rectangular cuboid and is arranged such that its longitudinal direction approximately coincides with the longitudinal direction of the casing. The modulator 11 modulates the laser light beam L11 and generates a modulated light beam. The modulator 11 is, for example a MZ (Mach-Zehnder) phase modulator for which InP (Indium phosphorus) is used as a constituent material and is a known one that is driven by the modulator driver 12 and that functions as an IQ modulator. Such a phase modulator is, for example, the same as that disclosed in International Publication Pamphlet No. WO 2016/021163. The modulator driver 12 is, for example, configured including an IC and its operations are controlled by the controller. The modulator 11 and the modulator driver 12 are arranged in series approximately in parallel in the longitudinal direction of the casing 1, thus configuring the modulation unit M. The terminator 13 electrically terminates the modulator 11 to which a high-frequency modulation signal is applied from the modulator driver 12.

The modulator 11 outputs modulated light beams L31 and L32 that are liner polarized light beams whose planes of polarization are orthogonal to each other and each of which is IQ modulated. The modulator 11 has a turning structure by which the direction in which the input light travels turns inside. As a result, in the modulator 11, a position in which the laser light beam L11 is input and a position in which the modulated light beams L31 and L32 are output are arranged on the same side surface, that is, in the embodiment, a side surface that is positioned on the front side of the modulator 11 in the longitudinal direction. The side surface of the modulator 11 that is positioned on the front side in the longitudinal direction is approximately parallel to the side wall part 1c of the casing 1 on the front side in the longitudinal direction.

The lens 14 collimates the modulated light beam L31 and outputs the modulated light beam L31 to the beam splitter 16. The beam splitter 16 reflects most of the modulated light beam L31 to the polarized beam combiner 17 and transmits part of the modulated light beam L31 and outputs the part of the modulated light beam L31 to the polarized beam combiner 17. The polarized beam combiner 17 performs polarized beam combining on the modulated light beams L31 and L32 and generates an output signal light beam L4 containing the modulated light beams L31 and L32. The polarized beam combiner 17 outputs part of the modulated light beam L32 to the monitor PD 19.

The monitor PD 18 receives the part of the modulated light beam L31 that is input from the beam splitter 16 and outputs a current signal corresponding to the intensity of the received light beam. The current signal is transmitted to the controller via the interconnect pattern that is formed on the terminal unit 1f and is used to monitor the intensity of the modulated light beam L31. The monitor PD 19 receives part of the modulated light beam L32 that is input from the polarized beam combiner 17 and outputs a current signal corresponding to the intensity of the received light beam. The current signal is transmitted to the controller via the interconnect pattern that is formed on the terminal unit 1f and is used to monitor the intensity of the modulated light beam L32.

The beam splitter 20 transmits most of the output signal light beam L4 and reflects part of the output signal light beam L4 and outputs the part of the output signal light beam L4 to the monitor PD 21. The monitor PD 21 receives the input part of the output signal light beam L4 from the beam splitter 20 and outputs a current signal corresponding to the intensity of the received light beam. The current signal is transmitted to the controller via the interconnect pattern that is formed on the terminal unit 1f and is used to monitor the intensity of the output signal light beam L4.

The signal light output port 1a receives the input of the output signal light beam L4 having transmitted through the beam splitter 20 and outputs the output signal light beam L4 to the outside of the casing 1.

Optical Receiver

Configurations and functions of components functioning as an optical receiver will be described next.

The signal light input port 1b receives an input of an input signal light beam L5 from outside and inputs the input signal light beam L5 to the lens 30. The input signal light beam L5 travels from the front side in the longitudinal direction to a rear side in the casing 1. The lens 30 focuses the input signal light beam L5 and causes the input signal light beam L5 to be input to the coherent mixer 31.

On the other hand, the mirror 32 reflects the laser light beam that is split by the beam splitter 8 and changes the travel direction from the left side in the width direction to the rear side in the longitudinal direction. The laser light beam L12 is focused by the lens 33 and is input as a local light beam to the coherent mixer 31.

The coherent mixer 31 has a shape of an approximate rectangular cuboid and is arranged such that its longitudinal direction approximately coincides with the longitudinal direction of the casing 1. In the coherent mixer 31, a position in which the input signal light beam L5 is input and a position in which the laser light beam L12 is input are on the same side surface, that is, in the embodiment, a side surface of the coherent mixer 31 that is positioned on the front side in the longitudinal direction. In the coherent mixer 31, the side surface to which the input signal light beam L5 is input is approximately parallel to the side wall part 1c of the casing 1 on the front side in the longitudinal direction and is approximately parallel to the side surface in the modulator 11 on which the position in which the laser light beam L11 is input and the positions in which the modulated light beams L31 and L32 are output are arranged.

The coherent mixer 31 processes the input laser light beam L12 serving as a local light beam and the input signal light beam L5 by causing the laser light beam L12 and the input signal light beam L5 to interfere with each other, generates a processed signal light beam, and outputs the processed signal light beam to the balanced PD array 35. The processed signal light beam consists of four light beams: an Ix signal light beam corresponding to an I component of an X-polarized wave, a Qx signal light beam corresponding to a Q component of a X-polarized wave, a Iy signal light beam corresponding to an I component of a Y-polarized wave, and a Qy signal light beam corresponding to a Q component of a Y-polarized wave. The coherent mixer 31 is, for example, a known one consisting of a PLC. The coherent mixer 31 is configured to split part of the input signal light beam L5 that is input and output the part of the input signal light beam L5 to the monitor PD 34. The monitor PD 34 receives part of the input signal light beam L5 and outputs a current signal corresponding to the intensity of the received light beam. The current signal is transmitted to the controller via the interconnect pattern that is formed on the terminal unit if and is used to monitor the intensity of the input signal light beam L5.

The balanced PD array 35 includes four balanced PDs, receives each of the four processed signal light beams, converts the light beams into current signals, and outputs the current signals to the TIA 36. The TIA 36 includes four TIAs and their operations are controlled by the controller. The respective TIAs of the TIA 36 convert the respective electric signals that are input from the respective four balanced PDs into voltage signals and outputs the voltage signals. The output voltage signals are transmitted to the controller or an upper control device via the interconnect pattern that is formed on the terminal unit if and are used to demodulate the input signal light beam L5.

The coherent mixer 31, the balanced PD array 35, and the TIA 36 are arranged in series approximately in parallel in the longitudinal direction of the casing 1, thus configuring an optical processing unit OP.

In the optical module 100, the laser device 2a and the wavelength locker 4 are arranged between a center line CL1 of the coherent mixer 31 in the width direction and a center line CL2 of the modulator 11 in the width direction in the width direction of the casing 1. Being arranged between the center line CL1 in the width direction and the center line CL2 in the width direction includes being arranged between extension lines obtained by extending each of the center lines to the outer side of the coherent mixer 31 or the modulator 11 in the longitudinal direction. The modulator 11 has a turning structure by which the direction in which the input light beam travels turns inside. The optical module 100 is configured such that the optical axes of the two light beams that are the input signal light beam L5 and the laser light beam L2 intersect with each other.

The laser device 2a and the wavelength locker 4 are arranged in series approximately in parallel in the longitudinal direction of the casing 1 and are arranged such that the position in the laser device 2a in which the laser light beam L2 to be input to the wavelength locker 4 is output and the position in the wavelength locker 4 in which the laser light beam L2 is input approximately coincide in the width direction of the casing 1. The laser assembly LA, the modulation unit M, and the optical processing unit OP are arranged in parallel in the width direction of the casing 1. In the modulator 11, the position in which the laser light beam L11 is input and the positions in which the modulated light beams L31 and L32 are output are arranged on the same side surface. The side surface and the side surface of the coherent mixer 31 to which the input signal light beam L5 is input are approximately in parallel. The two side surfaces are approximately parallel to the side wall part 1c of the casing 1 on the front side in the longitudinal direction.

In the optical module 100 configured as described above, parts that are longer in the longitudinal direction than in the width direction are usable for all the parts of the laser device 2a and the wavelength locker 4, the modulator 11, and the coherent mixer 31 and arranging them in parallel enables a width W equal to or smaller than 15 mm that is a length of the casing 1 in the width direction. Furthermore, the optical module 100 enables a length equal to or smaller than 35 mm from the end part of the casing in the longitudinal direction to an optical reference plane with which the facet of the optical fiber via which a light signal is input or output makes contact and enables a height equal to or smaller than 6.5 mm. Preferable examples are a width of approximately 14 mm, a length of approximately 31.5 mm, and a height of approximately 4 mm. Thus, it is possible to realize an optical transceiver according to the QSFP-DD standards that are MSA standards of the next generation.

In the case where components are housed in different casings as in the optical transceiver according to Japanese Laid-open Patent Publication No. 2016-081060, even when the optical transceiver is configured by housing them in one casing, it is difficult to enable the width equal to or smaller than 15 mm. For example, according to the CFP2-ACO standards, a uIITLA (Micro Integrated Tunable Laser Assembly) that is a light source mounted on an optical transceiver has a width of approximately 20 mm, a HBPMQ (High Bandwidth Integrated Polarization Multiplexed Quadrature Modulators) that is a modulator has a width of approximately 12.5 mm and, a uICR (Micro Intradyne Coherent Receiver) that is a receiver has a width of approximately 12.5 mm and, even when an optical transceiver is configured by housing them in a single casing, it is difficult to enable the width equal to or smaller than 15 mm.

Second Embodiment

Figure 3:
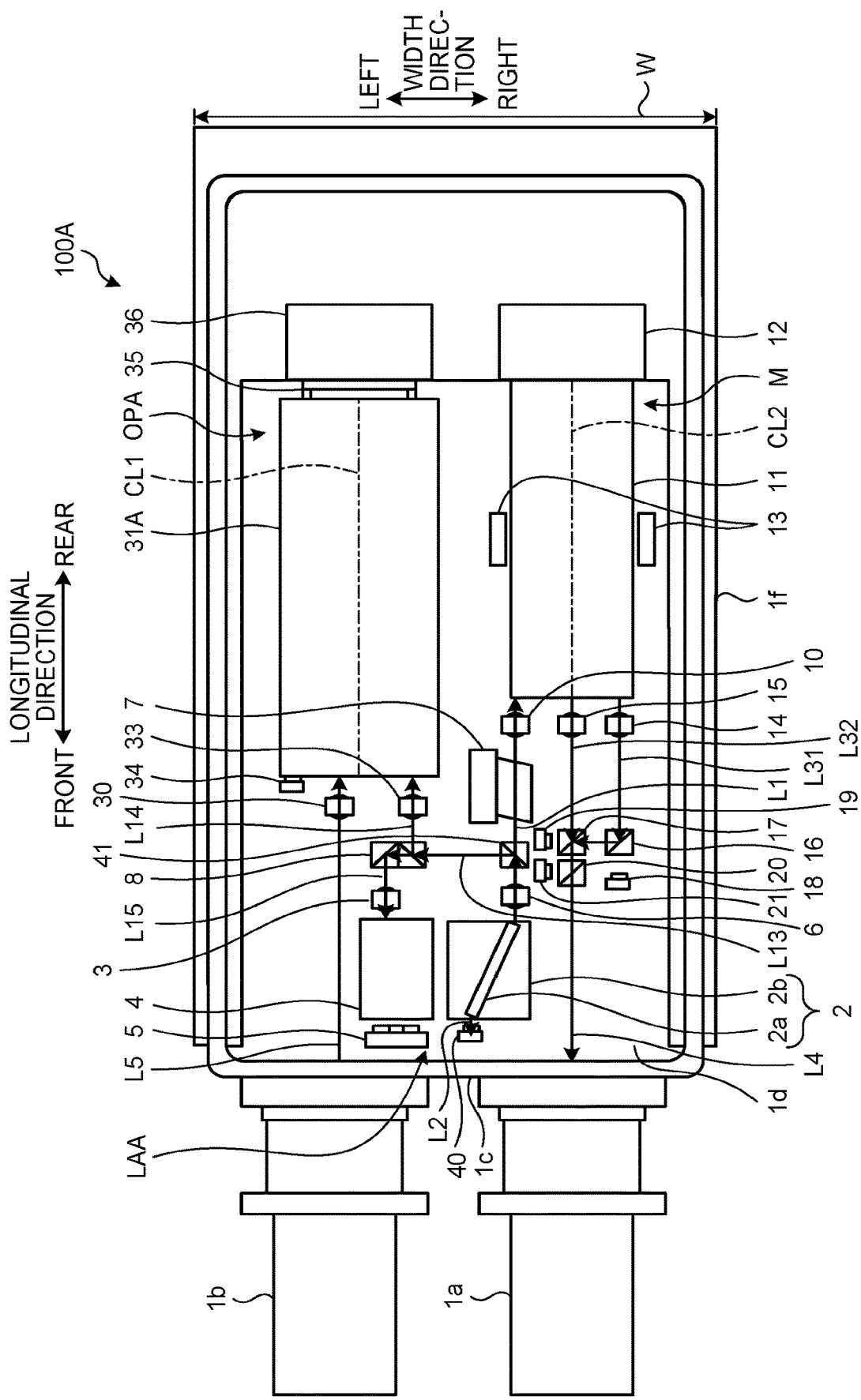
FIG. 3 is a schematic diagram illustrating an internal configuration of an optical module according to a second embodiment.

FIG. 3 is a schematic diagram illustrating an internal configuration of an optical module 100A according to a second embodiment. The optical module 100A has a configuration similar to that of the optical module 100 according to the first embodiment.

In the optical module 100A, the following components are housed: the chip on sub-mount 2, the lens 3, the wavelength locker 4, the PD array 5, the lens 6, the optical isolator 7, the beam splitter 8, the lens 10, the modulator 11, the modulator driver 12, the terminator 13, the lenses 14 and 15, the beam splitter 16, the polarized beam combiner 17, the monitor PDs 18 and 19, the beam splitter 20, and the monitor PD 21. Furthermore, in the optical module 100A, the following components are housed: the lens 30, a coherent mixer 31A, the lens 33, the monitor PD 34, the balanced PD array 35, the transimpedance amplifier (TIA) 36, a monitor PD 40, and a beam splitter 41.

As for the components of the optical module 100A, compared with the components of the optical module 100, the mirror 9 and mirror 32 are not housed and arrangement of the lens 30, the lens 33, and the monitor PD 34 is changed, the coherent mixer 31 is replaced with the coherent mixer 31A, and the monitor PD 40 and the beam splitter 41 are added.

In the optical module 100A, these components are mounted in the casing 1 and the casing 1 is sealed in an airtight manner with the top cover part 1e being attached thereto.

The optical module 100A is configured as an optical transceiver that outputs an output signal light beam from the signal light output port 1a and to which an input signal light beam is input from the signal light input port 1b. Configurations and functions of the respective components will be described below.

Optical Transmitter

First of all, configurations and functions of components that function as an optical transmitter will be described. Note that description of components having the same configurations and functions as those of the optical module 100 is omitted as appropriate.

The laser device 2a outputs a laser light beam L1 to the rear side of the casing 1 in the longitudinal direction. The laser device 2a outputs a laser light beam L2 for monitoring an intensity to the front side of the casing 1 in the longitudinal direction. The monitor PD 40 receives the laser light beam L2 and outputs a current signal corresponding to the intensity of the received light beam. The current signal is transmitted to the controller via the interconnect pattern that is formed on the terminal unit 1f and is used to monitor the intensity of the laser light beam L2.

The lens 6 collimates the laser light beam L1 and outputs the laser light beam L1 to the beam splitter 41. The beam splitter 41 transmits most of the laser light beam L1 to the optical isolator 7, reflects part of the laser light beam L1, and outputs the part of the laser light beam L1 as laser light beam L13 to the beam splitter 8.

The beam splitter 8 splits the laser light beam L13 into laser light beams L14 and L15. The laser light beam L14 will be described in detail below.

The lens 3 focuses the laser light beam l5 and causes the laser light beam L15 to be input to the wavelength locker 4. The wavelength locker 4 splits the laser light beam L15 into three laser light beams, outputs one of the laser light beams to the PD array 5, causes the remaining two laser light beams to pass through two filters, respectively, and then outputs the two laser light beams to the PD array 5.

The three PDs of the PD array 5 receive three laser light beams that are output by the wavelength locker 4, respectively, and outputs current signals corresponding to the intensities of the received light beams. Each of the current signals is transmitted to the controller and is used to detect and control the wavelength of the laser light beam L1.

The laser device 2a and the wavelength locker 4 are arranged in parallel in the width direction. The laser device 2a and the wavelength locker 4 are arranged such that a position in the laser device 2a in which the laser light beam L15 to be input to the wavelength locker 4 is output, that is, a position in which the laser light beam L1 is output, and a position in the wavelength locker 4 in which the laser light beam L15 is input are different from each other in the width direction, thereby configuring a laser assembly LAA.

The optical isolator 7 transmits the laser light beam L1 and causes the laser light beam L1 to be input to the lens 10. The lens 10 focuses the laser light beam L11 and causes the laser light beam L11 to be input to the modulator 11.

The modulator 11 is arranged such that its longitudinal direction approximately coincides with the longitudinal direction of the casing 1. The modulator 11 is driven by the modulator driver 12 and functions as an IQ modulator. Operations of the modulator driver 12 are controlled by the controller. The modulator 11 and the modulator driver 12 are arranged in series in the longitudinal direction of the casing 1, thereby configuring the modulation unit M. The terminator 13 electrically terminates the modulator 11.

The modulator 11 outputs modulated light beams L31 and L32 each of which is IQ modulated. The modulator 11 has a turning structure. As a result, in the modulator 11, a position in which the laser light beam L1 is input and positions in which the modulated light beams L31 and L32 are output are arranged on the same side surface that is arranged on the same side surface that is positioned on the front side in the longitudinal direction. The side surface of the modulator 11 that is positioned on the front side in the longitudinal direction is approximately parallel to the side wall part 1c of the casing 1 on the front side in the longitudinal direction.

The configurations and functions of the lens 14, the beam splitter 16, the lens 15, the polarized beam combiner 17, the monitor PDs 18 and 19, and the beam splitter 20 are the same as those of the corresponding components of the optical module 100 and thus description thereof is omitted. The signal light output port 1a receives an input of the output signal light beam L4 having transmitted through the beam splitter 20 and outputs the output signal light beam L4 to the outside of the casing 1.

Optical Receiver

Configurations and functions of components functioning as an optical receiver will be described next.

The signal light input port 1b receives an input of an input signal light beam L5 from outside and inputs the input signal light beam L5 to the lens 30. The lens 30 focuses the input signal light beam L5 and causes the input signal light beam L5 to be input to the coherent mixer 31A.

On the other hand, the laser light beam L14 that is split by the beam splitter 8 is focused by the lens 33 and is input as a local light beam to the coherent mixer 31A.

The coherent mixer 31A has a shape of an approximate rectangular cuboid and is arranged such that its longitudinal direction approximately coincides with the longitudinal direction of the casing 1. In the coherent mixer 31A, a position in which the input signal light beam L5 is input and a position in which the laser light beam L14 is input are arranged on the same side surface that is positioned on the front side of the coherent mixer 31A in the longitudinal direction. In the coherent mixer 31A, the side surface to which the input signal light beam L5 is input is approximately parallel to the side wall part 1c of the casing 1 on the front side in the longitudinal direction and is approximately parallel to the side surface of the modulator 11 on which the position in which the laser light beam L1 is input and the positions in which the modulated light beams L31 and L32 are output are arranged.

Like the coherent mixer 31, the coherent mixer 31A generates four processed signal light beams and outputs the processed signal light beams to the balanced PD array 35.

The coherent mixer 31A is configured to split part of the input signal light beam L5 that is input and output the part of the input signal light beam L5 to the monitor PD 34. The monitor PD 34 is used to monitor the intensity of the input signal light beam L5.

The configurations and functions of the balanced PD array 35 and the TIA 36 are the same as those of the components corresponding to the optical module 100 and thus description thereof is omitted.

The coherent mixer 31A, the balanced PD array 35, and the TIA 36 are arranged in series approximately in parallel in the longitudinal direction of the casing 1, thus configuring an optical processing unit OPA.

In the optical module 100A, the laser device 2a is arranged such that the laser device 2a outputs the laser light beam L1 in a direction opposite to the side on which the signal light output port 1a is arranged (the front side in the longitudinal direction) in the casing 1 (the direction of the rear side in the longitudinal direction). The laser device 2a and the wavelength locker 4 are arranged between a center line CL1 of the coherent mixer 31A in the width direction and a center line CL2 of the modulator 11 in the width direction in the width direction of the casing 1. The modulator 11 has a turning structure by which the direction in which the input light travels is turned inside.

The laser device 2a and the wavelength locker 4 are arranged such that the position in the laser device 2a in which the laser light beam L15 (the laser light beam L1) to be input to the wavelength locker 4 is output and the position in the wavelength locker 4 in which the laser light beam L15 is input are different from each other in the width direction. The modulation unit M and the optical processing unit OPA are arranged in parallel in the width direction of the casing 1. In the modulator 11, the position in which the laser light beam L1 is input and the positions in which the modulated light beams L31 and L32 are output are arranged on the same side surface. The side surface and the side surface of the coherent mixer 31A to which the input signal light beam L5 is input are approximately in parallel. The two side surfaces are approximately parallel to the side wall part 1c of the front side of the casing 1 in the longitudinal direction.

In the optical module 100A configured as described above, it is unnecessary to arrange the wavelength locker 4 on the same axis in the longitudinal direction as that of the laser device 2a. Thus, the same type of part larger in the width direction than the part used in the optical module 100 (for example, the coherent mixer 31A corresponding to the coherent mixer 31) is usable and, with a width W equal to or smaller than 15 mm that is a length of the casing 1 in the width direction being maintained, a length equal to or smaller than 35 mm from the end part of the casing in the longitudinal direction to an optical reference plane and a height equal to or smaller than 6.5 mm are enabled. Thus, it is possible to realize an optical transceiver according to the QSFP-DD standards that are MSA standards of the next generation.

Third Embodiment

Figure 4:
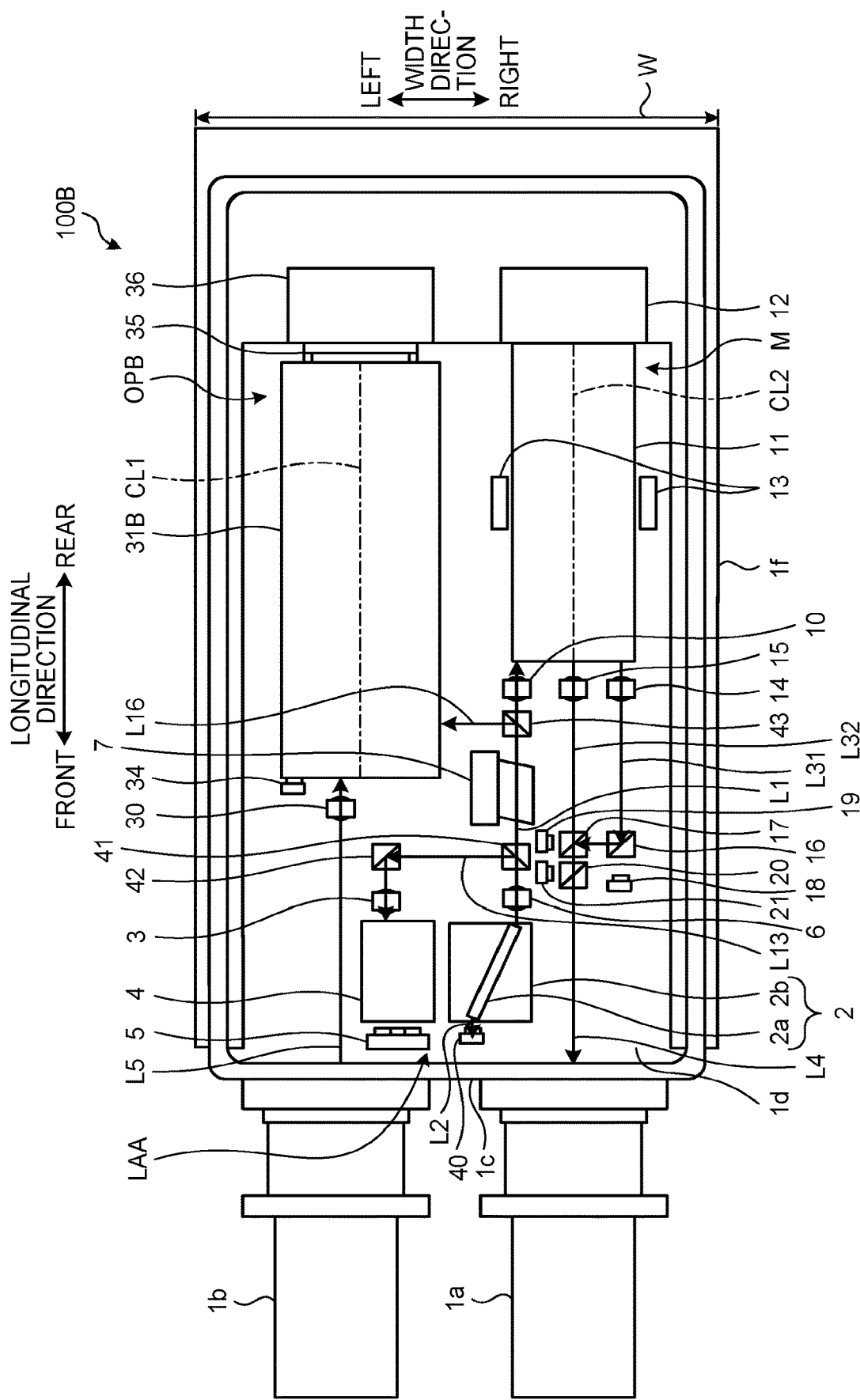
FIG. 4 is a schematic diagram illustrating an internal configuration of an optical module according to a third embodiment.

FIG. 4 is a schematic diagram illustrating an internal configuration of an optical module 100B according to a third embodiment. The optical module 100B has a configuration similar to that of the optical module 100A according to the second embodiment.

In the optical module 100B, the following components are housed: the chip on sub-mount 2, the lens 3, the wavelength locker 4, the PD array 5, the lens 6, the optical isolator 7, the lens 10, the modulator 11, the modulator driver 12, the terminator 13, the lenses 14 and 15, the beam splitter 16, the polarized beam combiner 17, the monitor PDs 18 and 19, the beam splitter 20, and the monitor PD 21. Furthermore, in the optical module 100B, the following components are housed: the lens 30, a coherent mixer 31B, the monitor PD 34, the balanced PD array 35, the transimpedance amplifier (TIA) 36, the monitor PD 40, the beam splitter 41, a mirror 42, and a beam splitter 43.

As for the components of the optical module 100B, compared with the components of the optical module 100A, the beam splitter 8 and the lens 33 are not housed, the coherent mixer 31A is replaced with the coherent mixer 31B, and the mirror 42 and the beam splitter 43 are added.

In the optical module 100B, these components are mounted in the casing 1 and the casing 1 is sealed in an airtight manner with the top cover part 1e being attached thereto.

The optical module 100B is configured as an optical transceiver that outputs an output signal light beam from the signal light output port 1a and to which an input signal light beam is input from the signal light input port 1b serving as an optical input unit. Configurations and functions of the respective components will be described below.

Optical Transmitter

First of all, configurations and functions of components that function as an optical transmitter will be described. Note that description of components having the same configurations and functions as those of the optical module 100 is omitted as appropriate.

The laser device 2a outputs a laser light beam L1 to the rear side of the casing 1 in the longitudinal direction. The laser device 2a outputs a laser light beam L2 for monitoring an intensity to the front side of the casing 1 in the longitudinal direction. The monitor PD 40 receives the laser light beam L2 and outputs a current signal corresponding to the intensity of the received light beam.

The lens 6 collimates the laser light beam L1 and outputs the collimated laser light beam L1 to the beam splitter 41. The beam splitter 41 transmits most of the laser light beam L1 to the optical isolator 7 and outputs part of the laser light beam L1 as laser light beam L13 to the mirror 42.

The mirror 42 reflects the laser light beam L13 to the lens 3.

The lens 3 focuses the laser light beam L13 and causes the laser light beam L13 to be input to the wavelength locker 4. The wavelength locker 4 splits the laser light beam L13 into three laser light beams, outputs one of the three laser light beams to the PD array 5, causes the remaining two laser light beams to pass through two filters, respectively, and then outputs the two light beams to the PD array 5.

The three PDs of the PD array 5 receives the three laser light beams that the wavelength locker 4 outputs, respectively, and outputs current signals corresponding to the intensities of the received light beams.

The laser device 2a and the wavelength locker 4 are arranged in parallel in the width direction. The laser device 2a and the wavelength locker 4 are arranged such that a position in the laser device in which the laser light beam L13 to be input to the wavelength locker 4 is output, that is, a position in which the laser light beam L1 is output and a position in the wavelength locker 4 in which the laser light beam L13 is input are different from each other in the width direction, thereby configuring the laser assembly LAA.

The optical isolator 7 transmits the laser light beam L1 and causes the laser light beam L1 to be input to the beam splitter 43. The beam splitter 43 transmits most of the laser light beam L1 to the lens 10, reflects part of the laser light beam L1, and outputs the part of the laser light beam L1 as the laser light beam L16 to the coherent mixer 31B. The lens 10 focuses the laser light beam L1 and causes the laser light beam L1 to be input to the modulator 11. The laser light beam L16 will be described in detail below.

The modulator 11 is arranged such that its longitudinal direction approximately coincides with the longitudinal direction of the casing 1. The modulator 11 is driven by the modulator driver 12 and functions as an IQ modulator. Operations of the modulator driver 12 are controlled by the controller. The modulator 11 and the modulator driver 12 are arranged in series in the longitudinal direction of the casing 1, thus configuring the modulation unit M. The terminator 13 electrically terminates the modulator 11.

The modulator 11 outputs light beams L31 and L32 that are IQ-modulated. The modulator 11 has a turning structure. As a result, in the modulator 11, a position in which the laser light beam L1 is input and positions in which the modulated light beams L31 and L32 are output are arranged on the same side surface that is positioned on the front side in the longitudinal direction. The side surface of the modulator 11 that is positioned on the front side in the longitudinal direction is approximately parallel to the side wall part 1c of the casing 1 on the front side in the longitudinal direction.

The configurations and functions of the lens 14, the beam splitter 16, the lens 15, the polarized beam combiner 17, the monitor PDs 18 and 19, and the beam splitter 20 are the same as those of the corresponding components of the optical module 100 and thus description thereof is omitted.

The signal light output port 1a receives an input of an output signal light beam L4 having transmitted through the beam splitter 20 and outputs the output signal light beam L4 to the outside of the casing 1.

Optical Receiver

Configurations and functions of components functioning as a light receiver will be described next.

The signal light input port 1b receives an input of an input signal light beam L5 from outside and inputs the input signal light beam L5 to the lens 30. The lens 30 focuses the input signal light beam L5 to cause the input signal light beam L5 to be input to the coherent mixer 31B.

On the other hand, the laser light beam L16 that is split by the beam splitter 43 is input as a local light beam to the coherent mixer 31B.

The coherent mixer 31B has a shape of an approximate rectangular cuboid and is arranged such that its longitudinal direction approximately coincides with the longitudinal direction of the casing 1. In the coherent mixer 31B, a side surface on which a position in which the laser light beam L16 serving as a local light beam is input is approximately orthogonal to a side surface of the modulator 11 on which a position in which the laser light beam L1 is input and positions in which the modulated light beams L31 and L32 are output are arranged.

Like the coherent mixer 31, the coherent mixer 31B generates four processed signal light beams and outputs the processed signal light beams to the balanced PD array 35. The coherent mixer 31B is configured to split part of the input signal light beam L5 that is input and output the part of the input signal light beam L5 to the monitor PD 34. The monitor PD 34 is used to monitor the intensity of the input signal light beam L5.

The configurations and functions of the balanced PD array 35 and the TIA 36 are the same as those of the components corresponding to the optical module 100 and thus description thereof is omitted.

The coherent mixer 31A, the balanced PD array 35, and the TIA 36 are arranged in series approximately in parallel in the longitudinal direction of the casing 1, thus configuring an optical processing unit OPB.

In the optical module 100B, the laser device 2a is arranged such that the laser device 2a outputs a laser light beam L1 in a direction opposite to the side on which the signal light output port 1a is arranged (the front side in the longitudinal direction) in the casing 1 (the direction of the rear side in the longitudinal direction). The laser device 2a and the wavelength locker 4 are arranged between a center line CL1 of the coherent mixer 31A in the width direction and a center line CL2 of the coherent mixer 31A in the width direction in the width direction of the casing 1. The modulator 11 has a turning structure by which the direction in which the input light travels is turned inside.

The laser device 2a and the wavelength locker 4 are arranged such that the position in the laser device 2a in which the laser light beam L13 (the laser light beam L1) to be input to the wavelength locker 4 is output and a position in the wavelength locker 4 in which the laser light beam L13 is input are different from each other in the width direction. The modulation unit M and the optical processing unit OPB are arranged in parallel in the width direction of the casing 1. In the modulator 11, the position in which the laser light beam L1 is input and the positions in which the modulated light beams L31 and L32 are output are arranged on the same side surface. The side surface and the side surface of the coherent mixer 31B to which the laser light beam L16 (the local light beam) is input are approximately orthogonal to each other.

In the optical module 100B configured as described above, because it is unnecessary to arrange the wavelength locker 4 on the same axis in the longitudinal direction as that of the laser device 2a, the same type of part larger in the width direction than the part used in the optical module 100 (for example the coherent mixer 31B corresponding to the coherent mixer 31) is usable and, with a width W equal to or smaller than 15 mm that is a length of the casing 1 in the width direction being maintained, a length equal to or smaller than 35 mm from the end part of the casing in the longitudinal direction to an optical reference plane and a height equal to or smaller than 6.5 mm are enabled. Thus, it is possible to realize an optical transceiver according to the QSFP-DD standards that are MSA standards of the next generation.

Fourth Embodiment

Figure 5:
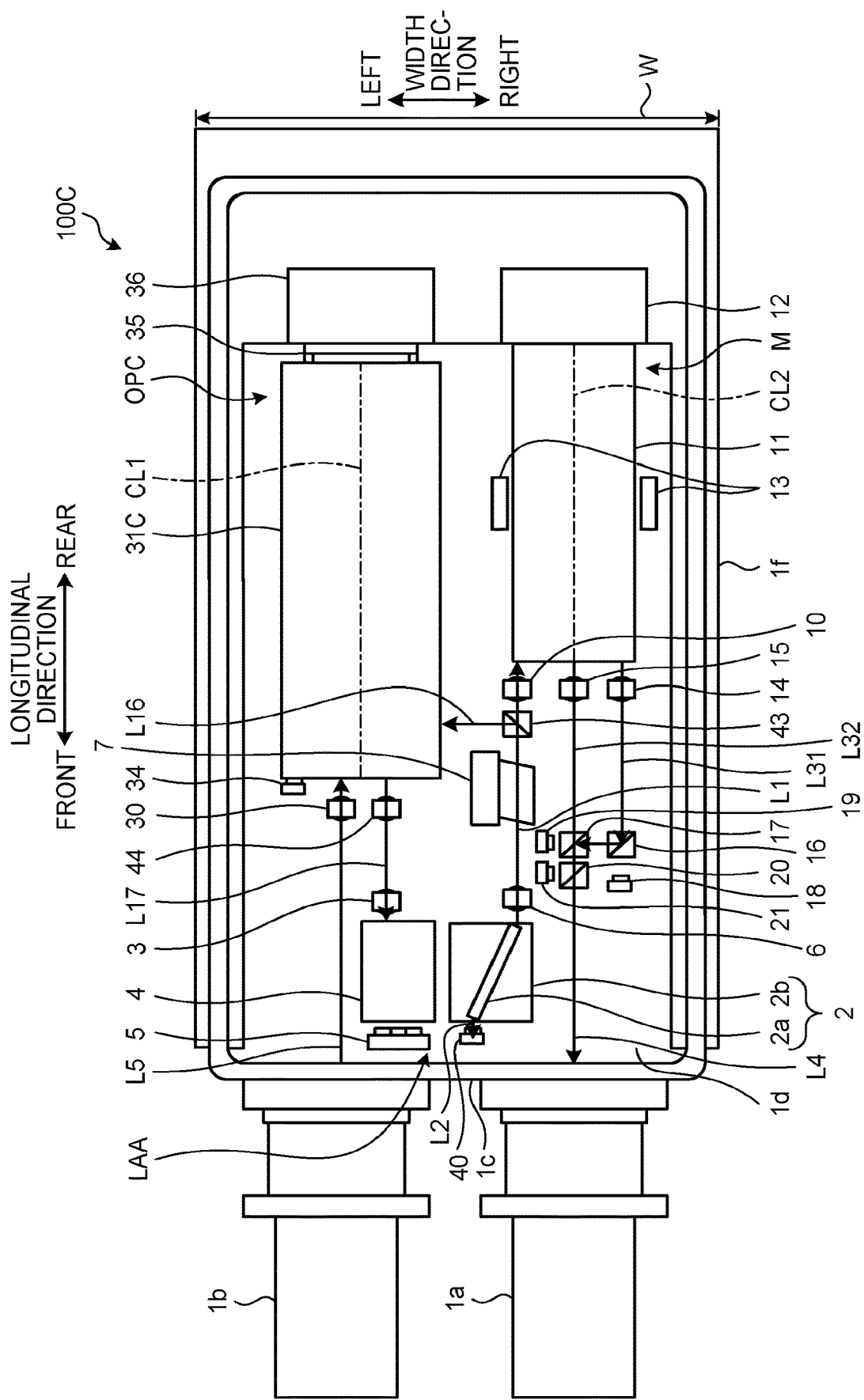
FIG. 5 is a schematic diagram illustrating an internal configuration of an optical module according to a fourth embodiment.

FIG. 5 is a schematic diagram illustrating an internal configuration of an optical module 100C according to a fourth embodiment. The optical module 100C has a configuration similar to that of the optical module 100B according to the third embodiment.

As for the components of the optical module 100C, compared to the components of the optical module 100B, the beam splitter 41 and the mirror 42 are not housed, the coherent mixer 31B is replaced with a coherent mixer 31C, and a lens 44 is added.

In the optical module 100C, these components are mounted in the casing 1 and the casing 1 is sealed in an airtight manner with the top cover part 1e being attached thereto.

The optical module 100C is configured as an optical transceiver as in the above-described embodiments. Configurations and functions of the respective components will be described below.

Optical Transmitter

First of all, configurations and functions of components that function as an optical transmitter will be described. Note that description of components having the same configurations and functions as those of the optical module 100 is omitted as appropriate.

The laser device 2a outputs a laser light beam L1 to the rear side of the casing 1 in the longitudinal direction. The laser device 2a outputs a laser light beam L2 to the front side of the casing 1 in the longitudinal direction. The monitor PD 40 receives the laser light beam L2 and outputs a current signal corresponding to the intensity of the received light beam.

The lens 6 collimates the laser light beam L1 and outputs the laser light beam L1 to the optical isolator 7.

The optical isolator 7 transmits the laser light beam L1 and causes the laser light beam L1 to be input to the beam splitter 43. The beam splitter 43 transmits most of the laser light beam L1 to the lens 10, reflects part of the laser light beam L1, and outputs the part of the laser light beam L1 as a laser light beam L16 to the coherent mixer 31C. The lens 10 focuses the laser light beam L1 and causes the laser light beam L1 to be input to the modulator 11.

After being input to the coherent mixer 31C, part of the laser light beam L16 is split and is output as a laser light beam L17 from a side surface of the coherent mixer 31C on the front side in the longitudinal direction.

The lens 3 focuses the laser light beam L17 and causes the laser light beam L17 to be input to the wavelength locker 4. The wavelength locker 4 splits the laser light beam L17 into three laser light beams, outputs one of the laser light beams to the PD array 5, causes the remaining two laser light beams to pass through two filters, respectively, and then outputs the two laser light beams to the PD array 5.

The three PDs of the PD array 5 receive three laser light beams that are output by the wavelength locker 4, respectively, and outputs current signals corresponding to the intensities of the received light beams.

The laser device 2a and the wavelength locker 4 are arranged in parallel in the width direction. The laser device 2a and the wavelength locker 4 are arranged such that a position in the laser device 2a in which the laser light beam L17 to be input to the wavelength locker 4 is output, that is, a position in which the laser light beam L1 is output and a position in the wavelength locker 4 in which the laser light beam L17 is input are different from each other in the width direction, thus configuring the laser assembly LAA.

The modulator 11 and the modulator driver 12 are arranged in series in the longitudinal direction of the casing 1, thus forming the modulation unit M. The terminator 13 electrically terminates the modulator 11.

The modulator 11 outputs modulated light beams L31 and L32. The modulator 11 has a turning structure. As a result, in the modulator 11, a position in which the laser light beam L1 is input and positions in which the modulated light beams L31 and L32 are output are arranged on the same side surface that is positioned on the front side in the longitudinal direction. The side surface of the modulator 11 that is positioned on the front side in the longitudinal direction is approximately parallel to the side wall part 1c of the casing 1 on the front side in the longitudinal direction.

The configurations and functions of the lens 14, the beam splitter 16, the lens 15, the polarized beam combiner 17, the monitor PDs 18 and 19, and the beam splitter 20 are the same as those of the corresponding components of the optical module 100 and thus description thereof is omitted.

The signal light output port 1a receives an input of an output signal light beam L4 having transmitted through the beam splitter 20 and outputs the output signal light beam L4 to the outside of the casing 1.

Optical Receiver

Configurations and functions of components functioning as a light receiver will be described next.

The signal light input port 1b receives an input of an input signal light beam L5 from outside and inputs the input signal light beam L5 to the lens 30. The lens 30 focuses the input signal light beam L5 and causes the input signal light beam L5 to be input to the coherent mixer 31C.

On the other hand, the remaining split part of the laser light beam L16 that is input from the beam splitter 43 is used as a local light beam.

The coherent mixer 31C has a shape of an approximate rectangular cuboid and is arranged such that its longitudinal direction approximately coincides with the longitudinal direction of the casing 1. In the coherent mixer 31C, a side surface on which a position in which the laser light beam L16 serving as a local light beam is input is approximately orthogonal to a side surface of the modulator 11 on which a position in which the laser light beam L1 is input and the positions in which the modulated light beams L31 and L32 are output are arranged.

The coherent mixer 31C generates four processed signal light beams and outputs the processed signal light beams to the balanced PD array 35. The coherent mixer 31C is configured to split part of the input signal light beam L5 that is input and output the input signal light beam L5 to the monitor PD 34. The monitor PD 34 is used to monitor the intensity of the input signal light beam L5.

The configurations and functions of the balanced PD array 35 and the TIA 36 are the same as those of the components corresponding to the optical module 100 and thus description thereof is omitted.

The coherent mixer 31C, the balanced PD array 35, and the TIA 36 are arranged in series approximately in parallel in the longitudinal direction of the casing 1, thus configuring an optical processing unit OPC.

In the optical module 100C, the laser device 2a is arranged such that the laser device 2a outputs a laser light beam L1 in a direction opposite to the side on which the signal light output port 1a is arranged (the front side in the longitudinal direction) in the casing (the direction of the rear side in the longitudinal direction). The laser device 2a and the wavelength locker 4 are arranged between a center line CL1 of the coherent mixer 31C in the width direction and a center line CL2 of the modulator 11 in the width direction in the width direction of the casing 1. The modulator 11 has a turning structure.

The laser device 2a and the wavelength locker 4 are arranged such that the position in the laser device 2a in which the laser light beam L17 (the laser light beam L1) to be input to the wavelength locker 4 is output and the position in the wavelength locker 4 in which the laser light beam L17 is input are different from each other in the width direction. The modulation unit M and the optical processing unit OPC are arranged in parallel in the width direction of the casing 1. In the modulator 11, the position in which the laser light beam L1 is input and the positions in which the modulated light beams L31 and L32 are output are arranged on the same side surface. This side surface and the side surface of the coherent mixer 31C to which the input signal light beam L17 (the local light beam) is input are approximately orthogonal to each other.

In the optical module 100C configured as described above, because it is unnecessary to arrange the wavelength locker 4 on the same axis in the longitudinal direction as that of the laser device 2a, a smaller number of parts than that of the optical module 100 and parts larger in the width direction than the parts used in the optical module 100 are usable and, with a width W equal to or smaller than 15 mm that is a length of the casing 1 in the width direction being maintained, a length equal to or smaller than 35 mm from the end part of the casing in the longitudinal direction to an optical reference plane and a height equal to or smaller than 6.5 mm are enabled. Thus, it is possible to realize an optical transceiver according to the QSFP-DD standards that are MSA standards of the next generation.

Testing Method

Figure 6:
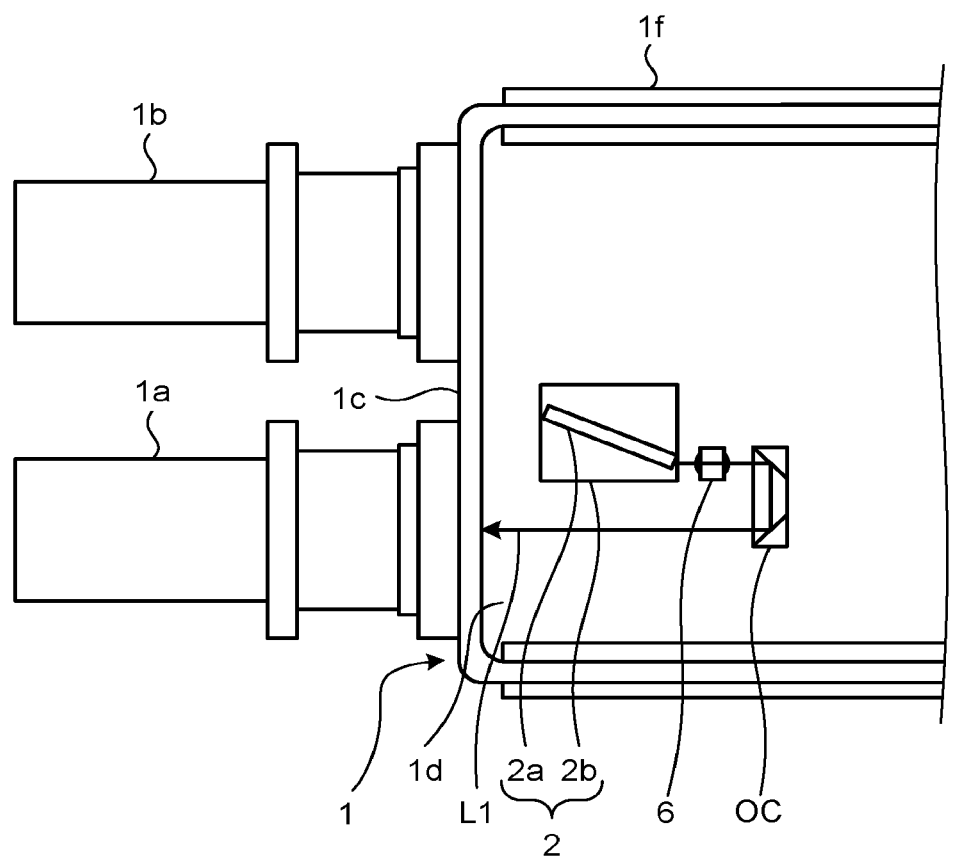
FIG. 6 is a schematic diagram for explaining an examination method.

FIG. 6 is a schematic diagram illustrating a method of testing in assembling the optical modules 100A to 100C according to the second to fourth embodiments. For example, when the laser device 2a is arranged in the casing 1, an optical axis change element OC is used. The optical axis change element OC is an element that changes the position of the optical axis of a laser light beam L1 that is input and outputs the laser light beam L1 in a direction opposite to the direction in which the laser light beam L1 is input. Using such an element makes it possible to examine accuracy of the position of the optical axis of the laser light beam L1 (the direction of height and the direction of width) and check the beam quality. Specifically, causing the laser light beam L1 from the signal light output port 1a to be output the outside of the casing 1 and observing the laser light beam L1 with a device, or the like, enables testing of the laser light beam L1 on accuracy of the position of the optical axis and beam quality. This realizes assembly of a small-sized optical transceivers with high quality.

Fifth Embodiment

Figure 7:
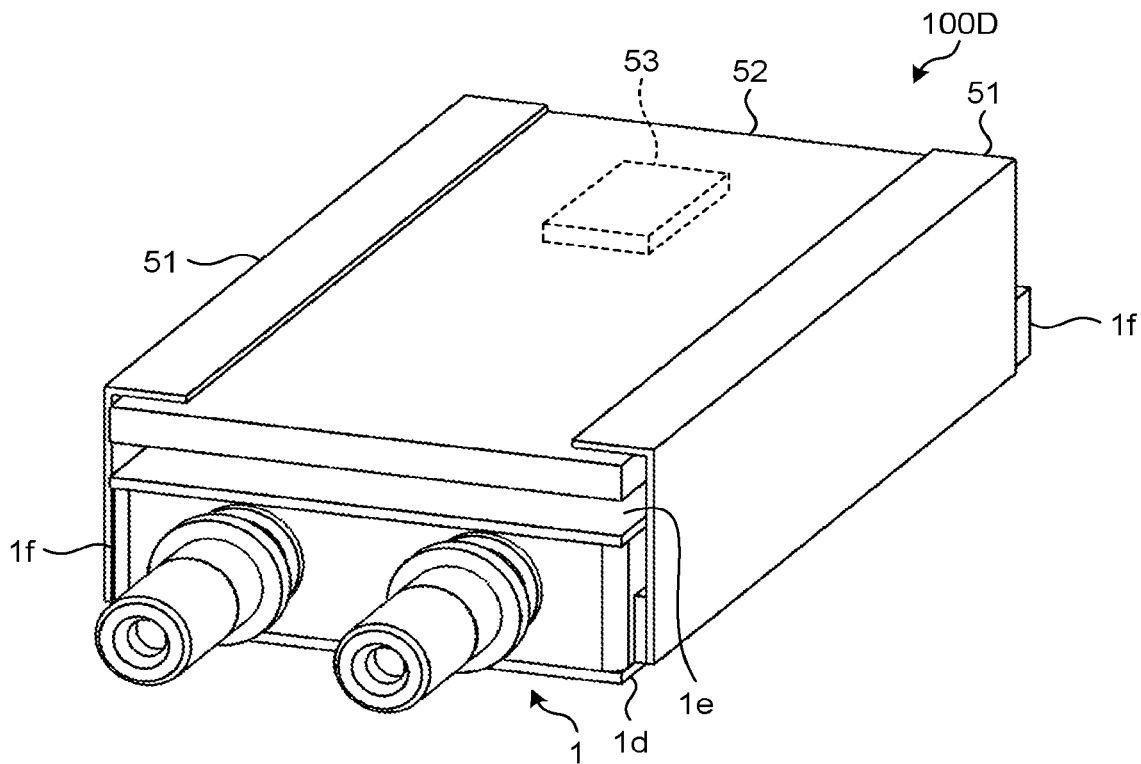
FIG. 7 is a schematic diagram illustrating an exterior of an optical module according to a fifth embodiment.

FIG. 7 is a schematic diagram illustrating an exterior of an optical module according to a fifth embodiment. Like the optical module 100 illustrated in FIG. 1, an optical module 100D includes the signal light output port 1a, the signal light input port 1b, the side wall part 1c, the bottom plate part 1d, the top cover part 1e, and the terminal unit 1f. The same components as those housed in the casing of the optical module according to any one of the above-described first to fifth embodiments are housed in the casing 1.

The optical module 100D further includes two flexible electronic boards 51, a platy electronic board 52, and a controller 53. The two flexible electronic boards 51 have interconnect patterns formed thereon and electrically connect the terminal unit 1f and the electronic board 52 with each other. On the electronic board 52, an interconnect pattern is formed and the controller 53 is mounted on the side of the top cover part 1e of the casing 1. The controller 53 controls operations of the optical module 100D and, for example, is configured including an IC. The controller 53 is electrically connected to components in the casing 1 via the terminal unit 1f, the flexible electronic boards 51, and the electronic board 52. The controller 53 is electrically connected an upper device not illustrated in the drawing, a connector pin, etc. The controller 53, for example, receives an instruction signal from the upper device and receives an electric signal from PDs, etc., that are housed in the casing 1. Based on these received signals, the controller 53 controls operations of the optical module 100D, mainly operations of an optical transmitter.

As described above, the controller 53 is mounted on a side opposite to the side on which a laser device, a wavelength locker, a modulator, a coherent mixer, a photoelectric element and a TIA are mounted in the direction of the height of the casing 1.

In the optical module 100D configured as described above, a length of the casing 1 in the width direction equal to or smaller than 15 mm is enabled. Preferably, a length from an end part of the casing in the longitudinal direction to an optical reference plane equal to or smaller than 35 mm is enabled, and a height equal to or smaller than 6.5 mm is enabled. Thus, it is possible to realize an optical transceiver according to the QSFP-DD standards that are MSA standards in the next generation.

Sixth Embodiment

Figure 8:
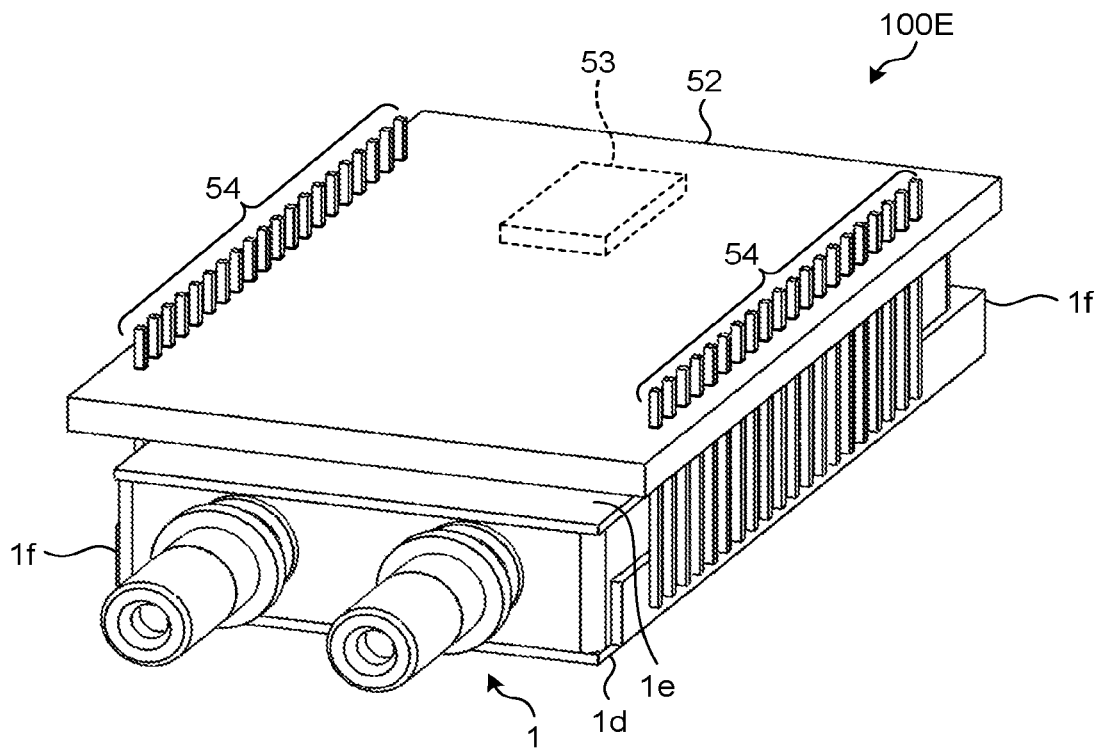
FIG. 8 is a schematic diagram illustrating an exterior of an optical module according to a sixth embodiment.

FIG. 8 is a schematic diagram illustrating an exterior of an optical module according to a sixth embodiment. An optical module 100E has a configuration obtained by replacing the flexible electronic boards 51 with a plurality of lead pins 54 in the configuration of the optical module 100D according to the fifth embodiment in FIG. 7.

In the optical module 100E configured as described above, a length of the casing 1 in the width direction equal to or smaller than 5 mm is enabled. Preferably, a length from an end part of the casing to an optical reference plane equal to or smaller than 35 mm is enabled and a height equal to or smaller than 6.5 mm is enabled. Thus, it is possible to realize an optical transceiver according to the QSFP-DD standards that are MSA standards in the next generation.

Seventh Embodiment

Figure 9:
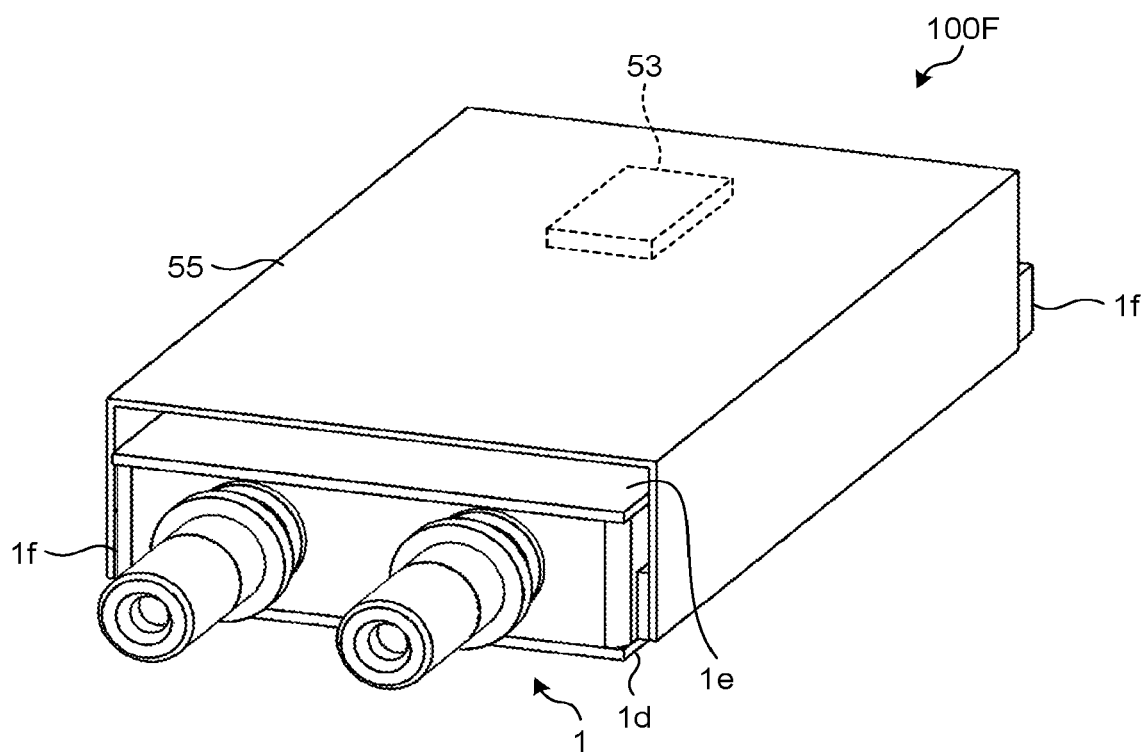
FIG. 9 is a schematic diagram illustrating an exterior of an optical module according to a seventh embodiment.

FIG. 9 is a schematic diagram illustrating an exterior of an optical module according to a seventh embodiment. An optical module 100F has a configuration obtained by replacing the two flexible electronic boards 51 and the electronic board 52 with one flexible electronic board 55 in the configuration of the optical module according to the fifth embodiment illustrated in FIG. 7. The controller 53 is mounted on the flexible electronic board 55.

In the optical module 100F configured as described above, a length of the casing 1 in the width direction equal to or smaller than 5 mm is enabled. Preferably, a length from an end part of the casing to an optical reference plane in the longitudinal direction equal to or smaller than 35 mm is enabled and a height equal to or smaller than 6.5 mm is enabled. Thus, it is possible to realize an optical transceiver according to the QSFP-DD standards that are MSA standards of the next generation.

In the above-described embodiments, the laser device 2a and the wavelength locker 4 are arranged between the center line of the coherent mixer in the width direction and the center line of the modulator in the with direction in the width direction of the casing 1. However, the present disclosure is not limited to this, and only any one of the laser device 2a and the wavelength locker 4 may be arranged between the two center lines in the width direction.

The above-described embodiments do not limit the present disclosure. The present disclosure covers ones configured by combining the above-described components as appropriate. Further effects and modifications can be derived easily by those skilled in the art. Thus, modes of the disclosure in a wider range are not limited to the above-described embodiments and various changes can be made.

According to an embodiment, an effect that it is possible to realize a small-sized optical transceiver is achieved.

The present disclosure is usable as an optical module for an optical device, such as an optical transceiver.

The invention claimed is:

1. An optical transceiver module comprising:
   an optical transmitter comprising:
   a laser device configured to output a laser light beam,
   a wavelength detector to which the laser light beam that is output from the laser device is input, the wavelength detector being configured to detect a wavelength of the input laser light beam, and
   a modulator configured to modulate the laser light beam and generate modulated light beam;
   a modulator driver configured to drive the modulator;
   an optical receiver comprising:
   a coherent mixer to which an input signal light beam that is input from outside the optical transceiver module and a local light beam are input, the coherent mixer being configured to process the input signal light beam and generate a processed signal light beam,
   a photoelectric element configured to convert the processed signal light beam into a current signal,
   a transimpedance amplifier configured to convert the current signal into a voltage signal; and
   a casing in which the laser device, the wavelength detector, the modulator, the modulator driver, the coherent mixer, the photoelectric element, and the transimpedance amplifier are mounted, and which is sealed in an airtight manner, wherein the casing comprises:
   an optical output unit configured to output an output signal light beam containing the modulated light beam generated by the optical transmitter for outputting from the optical transceiver module, and
   an optical input unit to which the input signal light beam is input to the optical transceiver module for input to the coherent mixer of the optical receiver; and
   wherein the optical transceiver module is configured such that:
   at least a part of a longitudinal side of the modulator faces a longitudinal side of the coherent mixer, with the laser device and the wavelength detector being arranged between the longitudinal side of the modulator and the longitudinal side of the coherent mixer which face each other, such that the casing has a length equal to or smaller than 15 mm in a width direction orthogonal to a longitudinal direction,
   the laser device or the wavelength detector is arranged, in the width direction of the casing, between a center line of the coherent mixer that extends in the longitudinal direction and a center line of the modulator that extends in the longitudinal direction,
   the coherent mixer, the modulator, and one of the laser device and the wavelength detector are all parts that are longer in the longitudinal direction than in the width direction and are arranged such that their longitudinal directions—are parallel to each other,
   the optical transceiver module has a height equal to or smaller than 6.5 mm and a length equal to or smaller than 35 mm, the length being measured from a first longitudinal end of the casing to an optical reference plane at a second longitudinal end of the casing which is opposite to the first longitudinal end, the optical reference plane being a plane where a face of an optical fiber which inputs or outputs a light signal makes contact with the optical transceiver module, and
   the optical transceiver module complies with a QSFP-DD standards.

2. The optical transceiver module according to claim 1, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

3. The optical transceiver module according to claim 1, wherein the laser device is arranged such that the laser device outputs the laser light beam in a direction opposite to a side on which the optical output unit is arranged in the casing.

4. The optical transceiver module according to claim 3, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

5. The optical transceiver module according to claim 1, wherein the modulator has a turning structure by which a direction in which light beam that is input travels turns inside.

6. The optical transceiver module according to claim 5, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

7. The optical transceiver module according to claim 1, wherein the optical transceiver module is configured such that optical axes of at least two light beams intersect with each other in the casing.

8. The optical transceiver module according to claim 7, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

9. The optical transceiver module according to claim 1,
   wherein the laser device and the wavelength detector are arranged such that a position in the laser device in which laser light beam to be input to the wavelength detector is output and a position in the wavelength detector in which the laser light beam is input differ from each other in the width direction of the casing,
   the modulator and the modulator driver are arranged in series approximately in parallel and thus configure a modulation unit,
   the coherent mixer, the photoelectric element, and the transimpedance amplifier are arranged in series approximately in parallel in the longitudinal direction of the casing and thus configure an optical processing unit, the modulation unit and the optical processing unit are arranged in parallel in the width direction,
   in the modulator, a position in which the laser light beam is input and a position in which the modulated light beam is output are arranged on the same side surface, and
   a side surface of the coherent mixer to which the input signal light beam and the local light beam are input approximately parallel to the side surface of the modulator.

10. The optical transceiver module according to claim 9, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

11. The optical transceiver module according to claim 1,
wherein the laser device and the wavelength detector are arranged such that a position in the laser device in which laser light beam to be input to the wavelength detector is output and a position in the wavelength detector in which the laser light beam is input differ from each other in the width direction of the casing,
the modulator and the modulator driver are arranged in series approximately in parallel in the longitudinal direction of the casing, thus configuring a modulation unit,
the coherent mixer, the photoelectric element, and the transimpedance amplifier are arranged in series approximately in parallel in the longitudinal direction of the casing, thus configure an optical processing unit,
the modulation unit and the optical processing unit are arranged in parallel in the width direction,
in the modulator, a position in which the laser light beam is input and a position in which the modulated light beam is output are arranged on the same side surface, and
a side surface of the coherent mixer to which the local light beam is input is approximately orthogonal to the side surface of the modulator.

12. The optical transceiver module according to claim 11, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

13. An optical transceiver module comprising:
an optical transmitter comprising:
a laser device configured to output a laser light beam,
a wavelength detector to which the laser light beam that is output from the laser device is input, the wavelength detector being configured to detect a wavelength of the input laser light beam, and
a modulator configured to modulate the laser light beam and generate modulated light beam;
a modulator driver configured to drive the modulator;
an optical receiver comprising:
a coherent mixer to which an input signal light beam that is input from outside the optical transceiver module and a local light beam are input, the coherent mixer being configured to process the input signal light beam and generate a processed signal light beam,
a photoelectric element configured to convert the processed signal light beam into a current signal, and
a transimpedance amplifier configured to convert the current signal into a voltage signal; and
a casing in which the laser device, the wavelength detector, the modulator, the modulator driver, the coherent mixer, the photoelectric element, and the transimpedance amplifier are mounted, and which is sealed in an airtight manner, wherein the casing comprises:
an optical output unit configured to output an output signal light beam containing the modulated light beam generated by the optical transmitter for outputting from the optical transceiver module; and
an optical input unit to which the input signal light beam is input to the optical transceiver module for input to the coherent mixer of the optical receiver; and
wherein the optical transceiver module is configured such that:
at least a part of a longitudinal side of the modulator faces a longitudinal side of the coherent mixer, with the laser device and the wavelength detector being arranged between the longitudinal side of the modulator and the longitudinal side of the coherent mixer which face each other, such that the casing has a length equal to or smaller than 15 mm in a width direction orthogonal to a longitudinal direction,
the laser device and the wavelength detector are arranged in series with each other and approximately in parallel with the longitudinal direction of the casing, and further arranged such that a position in the laser device in which laser light beam to be input to the wavelength detector is output and a position in the wavelength detector in which the laser light beam is input approximately coincide in the width direction of the casing, thus configuring a laser assembly,
the modulator and the modulator driver are arranged in series with each other and approximately in parallel in the longitudinal direction of the casing, thus configuring a modulation unit,
the coherent mixer, the photoelectric element, and the transimpedance amplifier are arranged in series with each other and approximately in parallel in the longitudinal direction of the casing, thus configuring an optical processing unit,
the laser assembly, the modulation unit, and the optical processing unit are arranged in parallel in the width direction,
in the modulator, a position in which the laser light beam is input and a position in which the modulated light beam is output are arranged on the same side surface,
a side surface of the coherent mixer to which the input signal light beam is input is approximately parallel to the side surface of the modulator,
the laser assembly, the modulation unit, and the optical processing unit are all parts that are longer in the longitudinal direction than in the width direction and are arranged such that their longitudinal directions are parallel to each other,
the optical transceiver module has a height equal to or smaller than 6.5 mm and a length equal to or smaller than 35 mm, the length being measured from a first longitudinal end of the casing to an optical reference plane at a second longitudinal end of the casing which is opposite to the first longitudinal end, the optical reference plane being a plane where a face of an optical fiber which inputs or outputs a light signal makes contact with the optical transceiver module, and
the optical transceiver module complies with a QSFP-DD standards.

14. The optical transceiver module according to claim 13, further comprising a controller that is mounted on a side opposite to a side of the casing in a height direction on which the laser device, the wavelength detector, the modulator, the coherent mixer, the photoelectric element, and the transimpedance amplifier are mounted, the controller being configured to control operations of the optical transceiver module.

* * * * *